(12) United States Patent
McCaffrey et al.

(10) Patent No.: US 11,976,568 B2
(45) Date of Patent: May 7, 2024

(54) CERAMIC MATRIX COMPOSITE COMPONENT HAVING LOW DENSITY CORE AND METHOD OF MAKING

(71) Applicant: RTX Corporation, Farmington, CT (US)

(72) Inventors: Michael G. McCaffrey, Windsor, CT (US); Bryan P. Dube, Chepachet, RI (US)

(73) Assignee: RTX CORPORATION, Farmington, CT (US)

( * ) Notice: Subject to any disclaimer, the term of this patent is extended or adjusted under 35 U.S.C. 154(b) by 0 days.

(21) Appl. No.: 18/298,047

(22) Filed: Apr. 10, 2023

(65) Prior Publication Data

US 2023/0250726 A1  Aug. 10, 2023

Related U.S. Application Data

(63) Continuation of application No. 16/797,123, filed on Feb. 21, 2020, now Pat. No. 11,624,287.

(51) Int. Cl.
*F01D 5/18* (2006.01)
*C04B 35/628* (2006.01)
(Continued)

(52) U.S. Cl.
CPC ........ *F01D 5/282* (2013.01); *C04B 35/62844* (2013.01); *C04B 35/62884* (2013.01); *C04B 35/80* (2013.01); *C23C 16/045* (2013.01); *F01D 5/18* (2013.01); *C04B 2235/5252* (2013.01); *C04B 2235/614* (2013.01);
(Continued)

(58) Field of Classification Search
CPC ..... F01D 5/282; F01D 5/18; C04B 35/62844; C04B 35/62884; C04B 35/80; C04B 2235/5252; C04B 2235/614; C23C 16/045; F05D 2220/32; F05D 2230/314; F05D 2300/6033

See application file for complete search history.

(56) References Cited

U.S. PATENT DOCUMENTS 1,833,751 A * 11/1931 Kimball .................... F01D 5/16
                                                        416/232
2,984,453 A *  5/1961 Heymann ................. F01D 5/16
                                                        416/500
(Continued)

FOREIGN PATENT DOCUMENTS

CN      105645966 A      6/2016
EP        3097268 B1 *  4/2019 ............ B22F 3/1055

OTHER PUBLICATIONS

Advisory Action issued in U.S. Appl. No. 16/797,133 dated Jul. 25, 2022, 3 pages.
(Continued)

*Primary Examiner* — Eric J Zamora Alvarez
*Assistant Examiner* — Theodore C Ribadeneyra
(74) *Attorney, Agent, or Firm* — CANTOR COLBURN LLP

(57) ABSTRACT

Disclosed is a ceramic matrix component having a fibrous core and a ceramic matrix composite shell surrounding at least a portion of the fibrous core. The ceramic matrix composite shell comprises a fibrous preform. The fibrous core has a greater porosity than the fibrous preform. A method of making the ceramic matrix component is also disclosed.

10 Claims, 2 Drawing Sheets

(51) Int. Cl.
*C04B 35/80* (2006.01)
*C23C 16/04* (2006.01)
*F01D 5/28* (2006.01)

(52) U.S. Cl.
CPC .... *F05D 2220/32* (2013.01); *F05D 2230/314* (2013.01); *F05D 2300/6033* (2013.01)

(56) References Cited

U.S. PATENT DOCUMENTS

| | | | |
|---|---|---|---|
| 2,999,669 A * | 9/1961 | McGinnis | F01D 5/16 416/500 |
| 3,240,468 A * | 3/1966 | Watts | F01D 5/183 415/117 |
| 3,966,357 A * | 6/1976 | Corsmeier | F01D 5/189 416/500 |
| 4,710,480 A | 12/1987 | Buschmann et al. | |
| 4,802,823 A * | 2/1989 | Decko | F01D 5/147 415/141 |
| 5,403,153 A | 4/1995 | Goetze | |
| 5,407,321 A * | 4/1995 | Rimkunas | F01D 5/16 416/500 |
| 5,594,216 A | 1/1997 | Yasukawa et al. | |
| 5,684,278 A | 11/1997 | Yasukawa et al. | |
| 5,947,688 A * | 9/1999 | Schilling | F01D 5/16 416/241 A |
| 6,033,186 A * | 3/2000 | Schilling | B64C 11/00 416/241 A |
| 6,627,019 B2 | 9/2003 | Jarmon et al. | |
| 6,827,551 B1 * | 12/2004 | Duffy | F01D 5/16 416/500 |
| 7,753,654 B2 | 7/2010 | Read et al. | |
| 8,038,408 B2 | 10/2011 | McMillan | |
| 8,137,611 B2 | 3/2012 | Merrill et al. | |
| 8,282,040 B1 | 10/2012 | Westman et al. | |
| 8,685,868 B2 | 4/2014 | Bouillon et al. | |
| 8,763,360 B2 * | 7/2014 | Murdock | F02K 3/06 416/235 |
| 8,980,435 B2 | 3/2015 | De Diego | |
| 9,663,404 B2 | 5/2017 | De Diego et al. | |
| 9,739,157 B2 | 8/2017 | Uskert et al. | |
| 9,759,090 B2 | 9/2017 | Uskert et al. | |
| 9,802,869 B2 | 10/2017 | Podgorski et al. | |
| 10,202,854 B2 | 2/2019 | Uskert et al. | |
| 10,392,696 B2 | 8/2019 | Bertrand et al. | |
| 10,400,612 B2 | 9/2019 | Freeman et al. | |
| 10,458,653 B2 | 10/2019 | Freeman et al. | |
| 10,465,534 B2 | 11/2019 | Freeman et al. | |
| 2004/0020176 A1 | 2/2004 | Kong | |
| 2004/0151592 A1 * | 8/2004 | Schreiber | F01D 5/18 416/231 R |
| 2005/0022921 A1 | 2/2005 | Morrison et al. | |
| 2005/0249602 A1 | 11/2005 | Freling et al. | |
| 2007/0274854 A1 | 11/2007 | Kelly et al. | |
| 2010/0109209 A1 | 5/2010 | Pasquero et al. | |
| 2010/0232968 A1 * | 9/2010 | Miller | F01D 5/26 416/190 |
| 2011/0318562 A1 | 12/2011 | Dry | |
| 2012/0093717 A1 | 4/2012 | Mauck et al. | |
| 2012/0196146 A1 | 8/2012 | Rice | |
| 2012/0266603 A1 | 10/2012 | Uskert et al. | |
| 2013/0004325 A1 | 1/2013 | McCaffrey et al. | |
| 2013/0058785 A1 * | 3/2013 | Kellerer | F16F 15/363 416/1 |
| 2013/0084189 A1 | 4/2013 | Diego | |
| 2013/0171426 A1 | 7/2013 | De Diego et al. | |
| 2013/0276455 A1 * | 10/2013 | Fisk | F01D 5/16 427/180 |
| 2013/0276457 A1 * | 10/2013 | Houston | F01D 9/041 416/232 |
| 2013/0280045 A1 * | 10/2013 | Dolansky | F01D 5/26 416/232 |
| 2014/0112769 A1 * | 4/2014 | Schoenenborn | F01D 5/16 29/889 |
| 2014/0121433 A1 | 5/2014 | Cizeron et al. | |
| 2014/0271153 A1 | 9/2014 | Uskert et al. | |
| 2014/0272377 A1 | 9/2014 | Chamberlain | |
| 2015/0034266 A1 | 2/2015 | Bruck et al. | |
| 2015/0086607 A1 | 3/2015 | Bruck et al. | |
| 2015/0361801 A1 * | 12/2015 | Blaney | F01D 5/16 416/232 |
| 2016/0017723 A1 | 1/2016 | McCaffrey | |
| 2016/0032729 A1 | 2/2016 | Turner | |
| 2016/0060115 A1 | 3/2016 | La Forest et al. | |
| 2016/0130953 A1 * | 5/2016 | Brandl | F01D 5/16 29/889.71 |
| 2016/0160658 A1 | 6/2016 | McCaffrey et al. | |
| 2016/0160660 A1 | 6/2016 | Shi et al. | |
| 2016/0177743 A1 | 6/2016 | Thomas et al. | |
| 2016/0222821 A1 * | 8/2016 | Klinetob | F01D 25/24 |
| 2016/0319669 A1 * | 11/2016 | Morris | F01D 5/147 |
| 2016/0333710 A1 * | 11/2016 | Klinetob | F01D 5/26 |
| 2016/0348511 A1 | 12/2016 | Varney | |
| 2017/0044910 A1 * | 2/2017 | Hartung | F04D 29/661 |
| 2017/0130585 A1 * | 5/2017 | Kray | F01D 5/16 |
| 2017/0183972 A1 * | 6/2017 | McDufford | F01D 5/22 |
| 2017/0190414 A1 * | 7/2017 | Andrews | B64C 27/001 |
| 2017/0275210 A1 | 9/2017 | Corman et al. | |
| 2018/0171806 A1 | 6/2018 | Freeman et al. | |
| 2018/0362413 A1 | 12/2018 | Hall et al. | |
| 2019/0071363 A1 | 3/2019 | Li et al. | |
| 2019/0211695 A1 | 7/2019 | Propheter-Hinckley et al. | |
| 2020/0024973 A1 | 1/2020 | Uskert et al. | |
| 2020/0308066 A1 | 10/2020 | Shiang et al. | |
| 2021/0262353 A1 | 8/2021 | McCaffrey et al. | |
| 2021/0262354 A1 | 8/2021 | McCaffrey et al. | |

OTHER PUBLICATIONS

European Search Report for European Application No. 21158087.3; Application Filing Date: Feb. 19, 2021; dated Jun. 22, 2021; 8 pages.
European Search Report for European Application No. 21158164.0; Application Filing Date: Feb. 19, 2021; dated Jul. 9, 2021; Date Received: Jul. 21, 2021; 9 pages.
Final Office Action issued in U.S. Appl. No. 16/797,133 dated May 3, 2022, 10 pages.
Non-Final Office Action issued in U.S. Appl. No. 16/797,133 dated Jan. 6, 2022, 25 pages.
Non-Final Office Action issued in U.S. Appl. No. 16/797,133 dated Oct. 20, 2022, 14 pages.
Restriction Requirement issued in U.S. Appl. No. 16/797,133 dated Oct. 8, 2021, 6 pages.
U.S. Non-Final Office Action issued in U.S. Appl. No. 16/797,133 dated Jun. 1, 2023, pp. 1-12.
OA Issued Sep. 13, 2023 in EP Application No. 21158164.0, 3 pages.

* cited by examiner

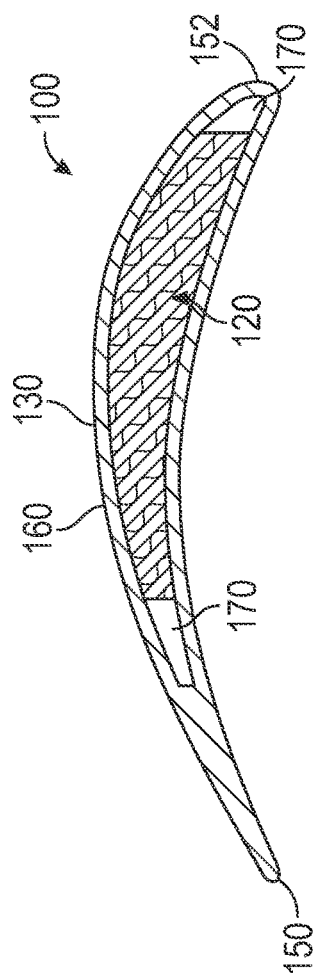
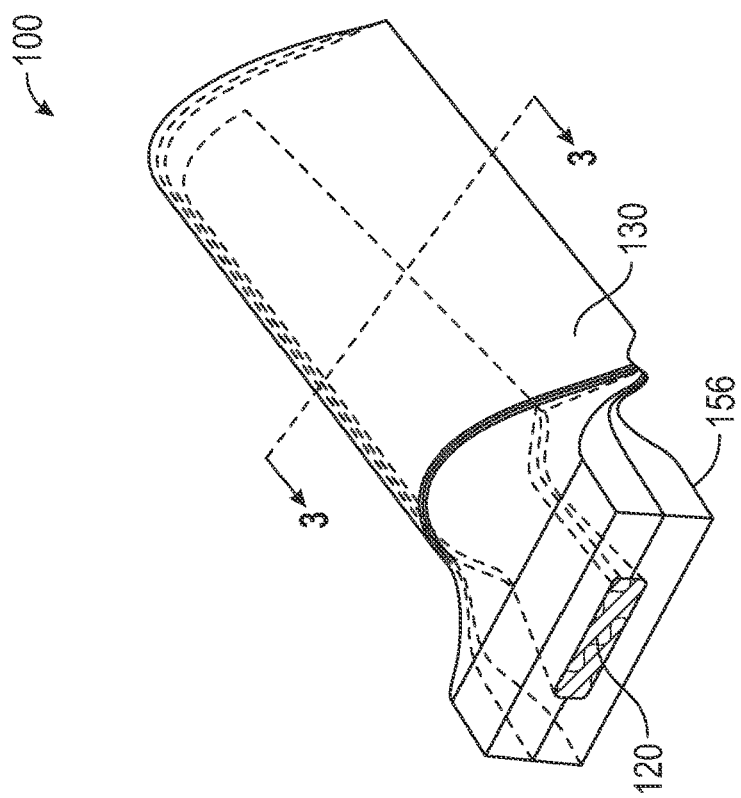

CERAMIC MATRIX COMPOSITE COMPONENT HAVING LOW DENSITY CORE AND METHOD OF MAKING

CROSS-REFERENCE TO RELATED APPLICATIONS

This application is a continuation of U.S. application Ser. No. 16/797,123 filed on Feb. 21, 2020, the disclosure of which is incorporated herein by reference in its entirety.

BACKGROUND

Exemplary embodiments pertain to the art of ceramic matrix composite components.

Ceramic matrix composite (CMC) materials have been proposed as materials for certain components of gas turbine engines, such as the turbine blades and vanes. Various methods are known for fabricating CMC components, including melt infiltration (MI), chemical vapor infiltration (CVI) and polymer pyrolysis (PIP) processes. CVI relies on infiltration to deposit matrix around preform fibers. Infiltration can be hindered when pores at the surface become filled with matrix before the interior. Various approaches have been suggested to address this issue but new solutions are needed.

BRIEF DESCRIPTION

Disclosed is a ceramic matrix component having a fibrous core and a ceramic matrix composite shell surrounding at least a portion of the fibrous core. The ceramic matrix composite shell comprises a fibrous preform. The fibrous core has a greater porosity than the fibrous preform.

In addition to one or more of the features described above, or as an alternative to any of the foregoing embodiments, the fibrous core porosity is 2-3 times greater than the porosity of the fibrous preform.

In addition to one or more of the features described above, or as an alternative to any of the foregoing embodiments, the fibrous core further comprises ceramic foam.

In addition to one or more of the features described above, or as an alternative to any of the foregoing embodiments, the ceramic foam is positioned at a leading edge of the fibrous core.

In addition to one or more of the features described above, or as an alternative to any of the foregoing embodiments, the ceramic foam is positioned at a trailing edge of the fibrous core.

In addition to one or more of the features described above, or as an alternative to any of the foregoing embodiments, the fibrous core comprises cooling passages.

In addition to one or more of the features described above, or as an alternative to any of the foregoing embodiments, cooling passages are located at a leading edge of the ceramic matrix component.

In addition to one or more of the features described above, or as an alternative to any of the foregoing embodiments, cooling passages are located at the trailing edge of the ceramic matrix component.

In addition to one or more of the features described above, or as an alternative to any of the foregoing embodiments, the ceramic matrix composite shell has a thickness greater than or equal to 0.03 inch.

Also disclosed is a method of making a ceramic matrix component. The method includes forming a fibrous core having a first porosity, forming a fibrous preform on the fibrous core wherein the fibrous preform has a porosity less than the first porosity, and forming a ceramic matrix on the fibrous preform using chemical vapor infiltration.

In addition to one or more of the features described above, or as an alternative to any of the foregoing embodiments, the fibrous core comprises ceramic foam.

In addition to one or more of the features described above, or as an alternative to any of the foregoing embodiments, the ceramic foam is positioned at a leading edge of the fibrous core.

In addition to one or more of the features described above, or as an alternative to any of the foregoing embodiments, the ceramic foam is positioned at a trailing edge of the fibrous core.

In addition to one or more of the features described above, or as an alternative to any of the foregoing embodiments, the fibrous core comprises sacrificial fibers.

In addition to one or more of the features described above, or as an alternative to any of the foregoing embodiments, the sacrificial fibers are located at a leading edge of the fibrous core.

In addition to one or more of the features described above, or as an alternative to any of the foregoing embodiments, the sacrificial fibers are located at a trailing edge of the fibrous core.

BRIEF DESCRIPTION OF THE DRAWINGS

The following descriptions should not be considered limiting in any way. With reference to the accompanying drawings, like elements are numbered alike:

FIG. 2 is a perspective view of a CMC component; and

FIG. 3 is a cross sectional view along line 2-2 of FIG. 2.

DETAILED DESCRIPTION

Figure 1:
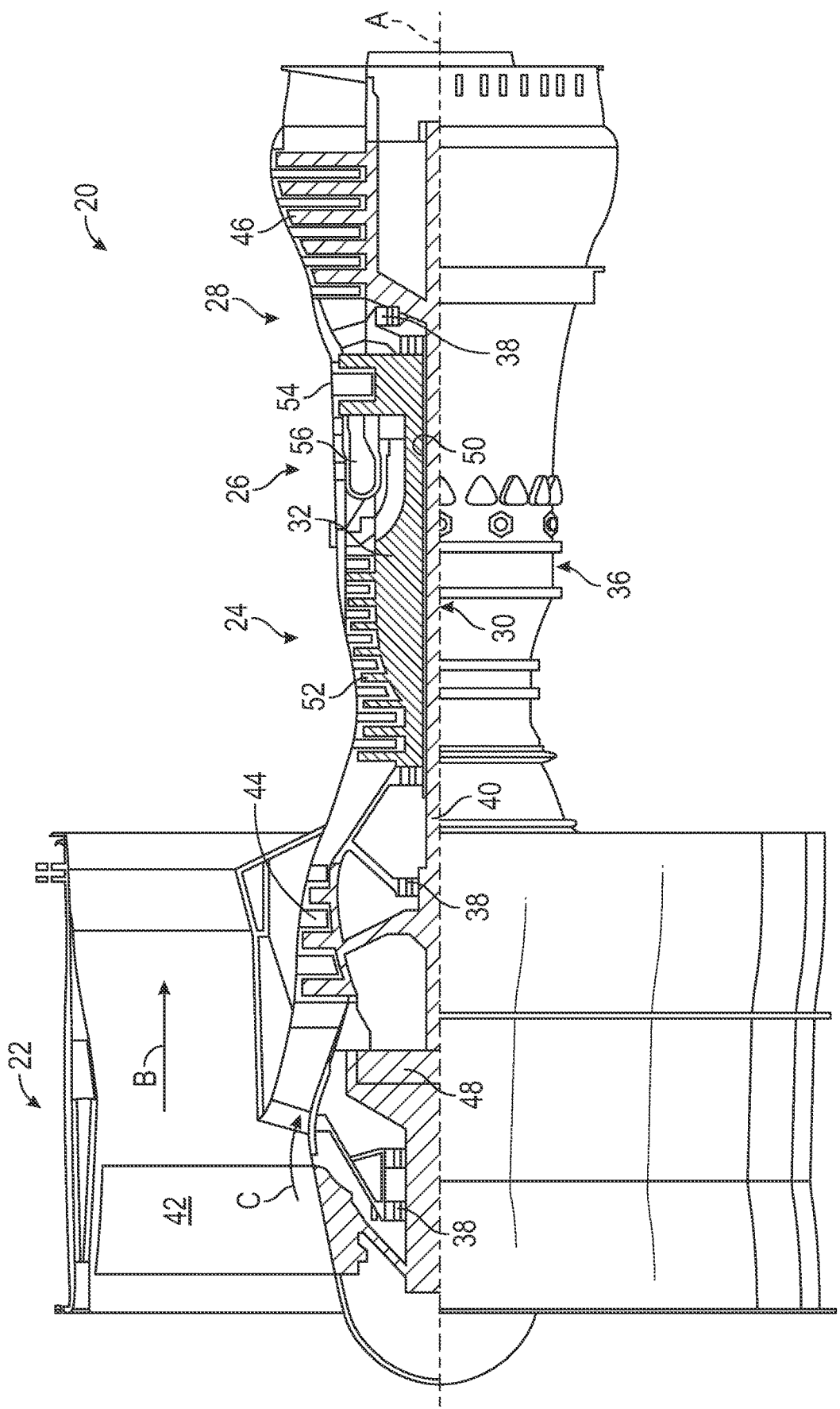
FIG. 1 is a partial cross-sectional view of a gas turbine engine.

A detailed description of one or more embodiments of the disclosed apparatus and method are presented herein by way of exemplification and not limitation with reference to the Figures. The CMC component and method of making the CMC component address several needs—the use of a fibrous core supports any shorter fibers or plies in the surrounding preform and composite shell and helps to prevent ply drops and reduces stress resulting from ply drops. Additionally, the greater porosity of the fibrous core offers access to the interior of the preform during CVI. Access to the interior of the preform improves infiltration and results in a CMC component with more uniform density.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include other systems or features. The fan section 22 drives air along a bypass flow path B in a bypass duct, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a low pressure compressor 44 and a low pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a high pressure compressor 52 and high pressure turbine 54. A combustor 56 is arranged in exemplary gas turbine 20 between the high pressure compressor 52 and the high pressure turbine 54. An engine static structure 36 is arranged generally between the high pressure turbine 54 and the low pressure turbine 46. The engine static structure 36 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present disclosure is applicable to other gas turbine engines including direct drive turbofans.

FIG. 2 is a perspective view of a ceramic matrix composite (CMC) component 100. In one embodiment, component 100 is, but not limited to, a gas turbine engine component, including combustor components, high pressure turbine vanes and blades, and other hot section components, such as but not limited to, airfoils, vanes, ceramic box shrouds and nozzle applications. As shown in FIGS. 2-3, the CMC component 100 is a blade. Component 100 includes a fibrous core 120 and a ceramic matrix composite (CMC) shell 130 surrounding at least a portion of fibrous core 120. Fibrous core 120 remains in place during operation of CMC component 100. Fibrous core 120 is formed from a material that withstands the CMC curing process and becomes a part of the final CMC component 100. Component 100 also has a root 156 and core 120 extends into the root. It is also contemplated that in to root the core may take the shape of two channels for the introduction of matrix precursors during CVI.

Material for the fibrous core 120 includes, but is not limited to, carbon, $Al_2O_3$-$Sio_2$, SIC, silicon dioxide ($SiO_2$), aluminum silicate, aluminum oxide ($Al_2O_3$), titanium oxide ($TiO_2$), zirconium silicate, silicon nitride, boron nitride (BN), and combinations thereof. The fibrous core 120 includes braided or woven fibers. The fibrous core 120 has a porosity greater than the porosity of the preform used in the formation of the CMC shell 130. For example, the fibrous core 120 may have a porosity that is 2 to 3 times greater than the porosity of the shell preform. The fibrous core may also include passages for cooling air in addition to the porosity. These passages may be the result of weaving or may be formed using sacrificial materials.

The fibrous core may further include a ceramic foam portion. The ceramic foam portion may be located centrally in the fibrous core and be at least partially surrounded by fibers or the ceramic foam may be disposed between the braided or woven portion of the fibrous core and the CMC shell 130. It is further contemplated that the fibrous core may include ceramic foam at the leading edge, trailing edge or both to facilitate the formation of sharp edge. Using a ceramic foam at these locations offers the advantage of being able to machine the material without damaging fiber continuity.

CMC shell 130 includes a preform and a ceramic matrix. The preform includes reinforcing fibers such as those used in the fibrous core. In some embodiments the fibrous core and the preform employ the same type of fiber such as SiC. The matrix material may include carbon (C), silicon carbide (SiC), silicon oxide ($SiO_2$), boron nitride (BN), boron carbide ($B_4C$), aluminum oxide ($Al_2O_3$), zirconium oxide ($ZrO_2$), zirconium boride ($ZrB_2$), zinc oxide ($ZnO_2$), molybdenum disulfide ($MoS_2$), silicon nitride ($Si_3N_4$), and combinations thereof. Exemplary combinations include SiC fiber in a SiC matrix with a SiC/C fiber core.

As shown in FIG. 3, component 100 is blade having a leading edge 152 and a trailing edge 150. CMC shell 130 of the blade surrounds at least a portion of the fibrous core. The CMC shell 130 may completely surround the fibrous core 120. The sidewalls 160 of the CMC shell 130 are adjacent to the fibrous core 120 and generally joined by fibrous core 120. The fibrous core 120 may include a ceramic foam 170 at the leading edge, the trailing edge or both.

Fibrous core 120 functions as a mandrel in fabricating CMC component 100. Fibrous core 120 receives or is wrapped by the reinforcing fibers of the preform. The preform includes uniaxial fiber layup, 2D woven fabric layup, 3D weave or a combination thereof. The preform is then infiltrated with the matrix or a matrix precursor. The matrix may be deposited using chemical vapor infiltration (CVI) or other appropriate methods.

The fibrous core may include sacrificial fibers or bundles of sacrificial fibers to create cooling passages within the finished CMC component 100. The sacrificial fibers may be carbon fiber, polymer fiber or a combination thereof. The composition of the sacrificial fiber will impact when the sacrificial material is removed. Polymer materials may be removed before CVI and carbon materials may be removed after CVI. The distribution and size of the sacrificial fibers or sacrificial fiber bundles may be selected by locations with a larger concentration and or larger size near the leading edge, trailing edge, or both.

The CMC shell 130 may have a thickness of 0.03 inch (0.76 mm) to >0.10 inch (>2.5 mm). The CMC shell thickness may vary over the length of the blade and may be thicker near the root compared to the tip.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A ceramic matrix component comprising a fibrous core and a ceramic matrix composite shell surrounding at least a portion of the fibrous core, wherein the ceramic matrix composite shell comprises a fibrous preform and the fibrous core has a greater porosity than the fibrous preform and the fibrous core further comprises ceramic foam and the ceramic foam is positioned at a trailing edge of the fibrous core.

2. The ceramic matrix component of claim 1, wherein a porosity of the fibrous core is 2-3 times greater than a porosity of the fibrous preform.

3. The ceramic matrix component of claim 1, wherein the fibrous core comprises cooling passages.

4. The ceramic matrix component of claim 3, wherein the cooling passages are located at a leading edge of the ceramic matrix component.

5. The ceramic matrix component of claim 3, wherein the cooling passages are located at the trailing edge of the ceramic matrix component.

6. The ceramic matrix component of claim 1, wherein the ceramic matrix composite shell has a thickness greater than or equal to 0.03 inch.

7. A method of making a ceramic matrix component comprising forming a fibrous core having a first porosity, forming a fibrous preform on the fibrous core wherein the fibrous preform has a porosity less than the first porosity, and forming a ceramic matrix on the fibrous preform using chemical vapor infiltration and the fibrous core further comprises ceramic foam and the ceramic foam is positioned at a trailing edge of the fibrous core.

8. The method of claim 7, wherein the fibrous core comprises sacrificial fibers.

9. The method of claim 8, wherein the sacrificial fibers are located at a leading edge of the fibrous core.

10. The method of claim 8, wherein the sacrificial fibers are located at a trailing edge of the fibrous core.

\* \* \* \* \*